United States Patent [19]

Shahriary et al.

[11] Patent Number: 5,130,671
[45] Date of Patent: Jul. 14, 1992

[54] PHASE-LOCKED LOOP FREQUENCY TRACKING DEVICE INCLUDING A DIRECT DIGITAL SYNTHESIZER

[75] Inventors: Iradj Shahriary, Santa Monica; Kevin M. McNab, Hawthorne, both of Calif.

[73] Assignee: Hughes Aircraft Company, Los Angeles, Calif.

[21] Appl. No.: 633,864

[22] Filed: Dec. 26, 1990

[51] Int. Cl.$^5$ .......................... H03L 7/12; H03L 7/16
[52] U.S. Cl. ......................................... 331/16; 331/4; 331/17; 331/34; 455/260
[58] Field of Search ....................... 331/1 A, 4, 10, 15, 331/16, 17, 18, 25, 34, DIG. 2; 375/120; 455/260

[56] References Cited

U.S. PATENT DOCUMENTS

| | | | |
|---|---|---|---|
| 4,568,888 | 2/1986 | Kimura et al. | 331/16 X |
| 4,577,163 | 3/1986 | Culp | 331/1 A |
| 4,855,683 | 8/1989 | Troudet et al. | 331/1 A X |
| 4,951,004 | 8/1990 | Sheffer et al. | 331/1 A |
| 4,965,533 | 10/1990 | Gilmore | 331/18 |

*Primary Examiner*—David Mis
*Attorney, Agent, or Firm*—Gordon R. Lindeen III; Steven M. Mitchell; Wanda K. Denson-Low

[57] ABSTRACT

Disclosed is a single phase-locked loop (50, 350) providing tuning over a very large bandwidth for use in wide band carrier tracking and clock recovery systems. In a first embodiment, a DC signal is formed representative of a phase difference between an input signal changing with time and a return signal. The DC signal is applied to a narrow band voltage controlled oscillator (68) which converts the DC signal back to an AC signal. The AC signal is level shifted to form a clocking pulse for an accumulator (80) of a direct digital synthesizer (72). A digital command word is also applied to the accumulator (80), such that the digital command word represents a coarse tuning of the input frequency. The clocking pulse from the narrow band VCO (68) supplies a fine tuning of the input frequency. In a second embodiment, the DC representative phase signal is applied to an analog-to-digital converter (364) which produces an N-bit word representative of the phase difference. The change in phase alters the digital output of the analog-to-digital converter (364) which in turn is applied to the accumulator (376) of a direct digital synthesizer (370). By this invention, very wide band tracting is capable with a single phase-locked loop, thus limiting the hardware and cost.

16 Claims, 3 Drawing Sheets

PHASE-LOCKED LOOP FREQUENCY TRACKING DEVICE INCLUDING A DIRECT DIGITAL SYNTHESIZER

BACKGROUND OF THE INVENTION

1. Technical Field

This invention relates generally to a carrier frequency tracking phase-locked loop, and more specifically, to a carrier frequency tracking phase-locked loop incorporating a direct digital synthesizer for providing a wide band carrier tracking and clock recovery system.

2. Discussion of the Related Art

Phase-locked loops are known in the art of carrier frequency tracking systems, such as systems for tracking satellites, for providing demodulation functions requiring regeneration of coherent carriers and clock signals. These phase-locked loops provide an effective means to track and lock onto a carrier signal having a frequency which varies widely with time. In a tracking and demodulation mode, the phase-locked loop regenerates a frequency changing carrier wave by locking onto the carrier wave and producing a stable and virtually noiseless replica of it.

Known phase-locked loops generally require a voltage controlled oscillator to reproduce the carrier signal. A typical voltage controlled oscillator (VCO) has a maximum effective bandwidth of approximately one octave because of the necessity to tune or align the VCO to the desirable range of frequencies. If a single VCO is used to cover more of a bandwidth than one octave, spectral purity is lost due to the presence of strong harmonics and loss of substantial noise performance. In addition, to accurately tune a single VCO beyond one octave requires the ability to compensate for excessive variations in tuning linearity exhibited by the VCO. Therefore, it has been the case in prior art phase-locked loop tracking systems that in order to provide the required tracking over a wide range of frequencies multiple VCO's are required.

FIG. 1 shows a known phase-locked loop incorporating multiple VCO's. In that figure, the signal on input line 12 represents a broad band input having a frequency which changes with time. Input line 12 is applied to a phase detector 14 along with a return line 16 which provides a feedback signal. An output line 18 from phase detector 14 is applied as an input to a voltage integrator low-pass loop filter 20. An output line 22 from low-pass filter 20 is applied as an input to a gain compensation circuit 24. An output of gain compensation circuit 24 on line 26 is applied to a first switch 28. Switch 28 has a plurality of outputs which are connected to a plurality of VCO's 30. An output of each VCO 30 is applied to a second switch 32 which has single output "$f_{out}$" on line 34. The feedback signal on line 16 is taken from output line 34 and applied to phase detector 14 to form the phase-locked loop.

In operation, phase detector 14 compares the phase of the input signal on line 12 and the feedback signal on line 16. The output on line 18 of phase detector 14 is a DC magnitude signal representative of this phase difference. Low-pass loop filter 20 actively removes any remaining AC components of the DC magnitude signal according to their frequencies. Gain compensation circuit 24 takes the pure DC signal on line 22 from low-pass loop filter 20 and provides gain compensation to modify the loop gain to a constant value regardless of the different loop gains and tuning parameters of the different VCO's or input signals. The output on line 26 of the gain compensation circuit 28 is applied to first switch 28 which selects the appropriate VCO depending on the frequency range of interest. Each VCO 30 takes the DC signal and converts it to a clean representative of the input signal on line 12. The rebuilt input signal is then applied to a second switch 32 which produces a single output. The output of switch 32 has a return line 16 applied to phase detector 14 as described above.

If the frequency of the input signal on line 12 changes, the change in phase of the input signal on line 12 and the locked signal on line 16 will modify the DC signal on line 18 to represent this phase change. This in turn will alter the output from VCO 30, or select a different VCO 30 depending on the change in phase, such that the frequency signal on return line 16 is matched to the frequency of the input signal 12. By this, the input signal on line 12 can be locked onto a certain input frequency such that a clean representative of this signal can be used by the system, such as an integrate and dump circuit, clocking system, etc., in which the phase-locked loop is incorporated. Therefore, noise, fading, etc. can be greatly eliminated and the carrier frequency can be effectively tracked.

FIG. 2 shows another prior art phase-locked loop tracking system 40 in which an input signal on line 42 having a frequency which changes in time is applied to a first switch 44. Switch 44 applies this input frequency signal to one of a plurality of different phase-locked loops 46 depending on its frequency Each phase-locked loop 46 represents the entire circuit of FIG. 1 with a single VCO. The output of each phase-locked loop 46 is applied to a second switch 47 to form a single output. This system is very costly, in that it requires multiply redundant hardware. In addition, each loop 46 must be separately tuned, aligned, and monitored for proper acquisition, tracking, stability and noise performance.

The phase-locked loop 10 of FIG. 1 requires less hardware than that of the system 40 of FIG. 2, but still requires the redundancy of multiple VCO's. Each VCO requires its own set of tuning characteristics and the addition of complex gain compensation circuitry to maintain proper loop performance.

Another known prior art tracking system similar to that of FIG. 1 is a single phase-locked loop having a single VCO with multiple varactor diode tuning circuits. This third system also requires vast amounts of tuning characteristics having gain compensation circuitry which varies with time, temperature, and radiation.

What is needed then is a single phase-locked loop capable of being tuned or aligned over a very broad band and requiring a large reduction in hardware and tuning requirements, and the cost associated with these reductions. It is therefore an object of this invention to provide a tracking system having very broad brand acquisition, high spectral purity and minimal hardware.

SUMMARY OF THE INVENTION

According to a first preferred embodiment of this invention, a phase-locked loop (PLL) tracking system is provided having a single narrow band voltage controlled oscillator (VCO) and a direct digital synthesizer (DDS). The DDS includes an accumulator having an N-bit register. The bits in the accumulator are set by a digital frequency command word which estimates the frequency of the input. This command word represents a coarse tuning of the DDS. The narrow band VCO applies a clock signal to the accumulator to adjust the rate of the output of the accumulator register, and thus acts as a fine tuning device for the DDS. The output of the accumulator is converted back to an analog frequency signal by a digital-to-analog converter, which in turn is applied to a phase detector of the PLL. The phase detector compares the phase of the signal from the digital-to-analog converter and an input signal to provide a DC magnitude signal which adjusts the output of the VCO. By this, a single PLL can be used over a very broad frequency range, and still maintain high frequency resolution. The VCO provides the necessary fine tuning to overcome any frequency resolution limitation of the DDS. A gain compensation circuit is used to keep the loop gain constant over the entire broad frequency range.

In a second preferred embodiment, the VCO of the first preferred embodiment described above is replaced by an N-bit analog-to-digital converter. The DC signal from the phase detector is applied to the analog-to-digital converter to set a digital word proportional to the phase difference. The digital word, representative of the input frequency is held in the analog-to-digital converter. A constant clock signal applied to the analog-to-digital converter determines the rate at which the digital word is outputted to the accumulator of the DDS. A constant clock signal is applied to the accumulator of the DDS to set the rate of output of the accumulator. The digital output of the accumulator is converted back to an analog frequency signal by a digital-to-analog converter. Because of the accuracy of the analog-to-digital converter over the entire tuning range, the need for a gain compensation circuit is completely obviated.

Additional objects, advantages, and features of the present invention will become apparent from the following description of the pending claims taken into conjunction with the accompanying drawings.

DETAILED DESCRIPTION OF THE PREFERRED EMBODIMENTS

The following discussion of the preferred embodiments of this invention are merely exemplary in nature, and are in no way intended to limit its application or uses.

Figure 1:
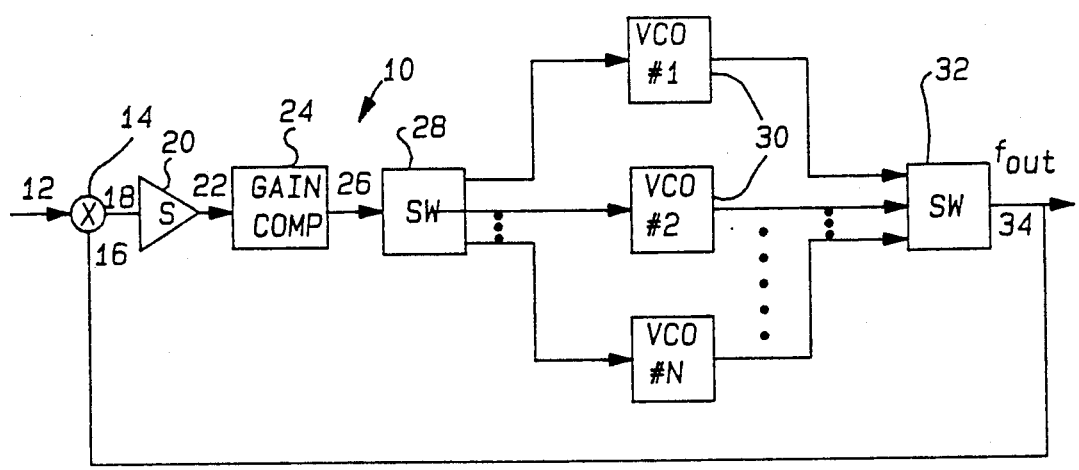
FIG. 1 is a block diagram of a prior art phase-locked loop incorporating multiple VCO's.
Figure 2:
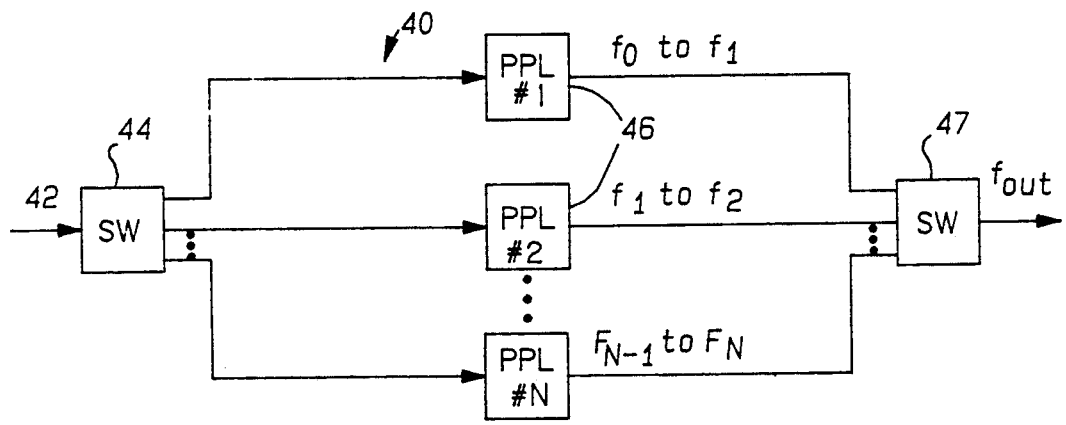
FIG. 2 is a block diagram of a prior art tracking system incorporating multiple phase-locked loops.
Figure 3:
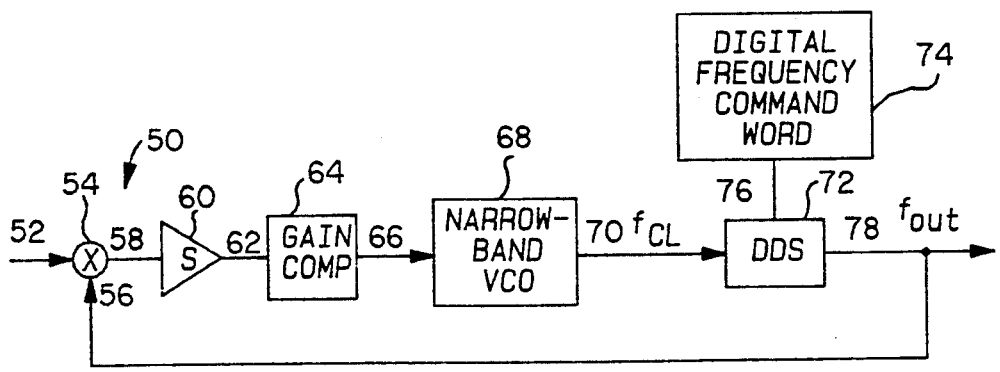
FIG. 3 is a block diagram of a phase-locked loop according to a first embodiment of the invention.

FIG. 3 shows a phase-locked loop (PLL) 50 similar to that of PLL 10 of FIG. 1, but having a single narrow band voltage controlled oscillator (VCO) 68 and a direct digital synthesizer (DDS) 72 as will be described hereunder. PLL 50 includes a phase detector 54 accepting a feedback signal on line 56 and an input signal on line 52 whose frequency varies with time. An output of phase detector 54 on line 58 is a DC magnitude signal representative of the phase difference between the input signal on line 52 and the return signal on line 56. The DC magnitude signal on line 58 is inputted into a voltage integrator low-pass loop filter 60. An output of loop filter 60 on line 62 is applied to a gain compensation network 64 to modify the gain of PLL circuit 50. The gain compensated signal on line 66 from gain compensation network 64 is applied to a narrow band voltage controlled oscillator (VCO) 68. VCO 68 produces an AC signal on line 70 which is inputted into a direct digital synthesizer 72. Direct digital synthesizer 72 accepts an N-bit digital frequency command word on line 76 from digital coarse tuning circuit 74 which estimates the frequency of the input signal on line 52. The AC signal on line 70 from VCO 68 acts as the clocking pulse to the DDS 72. An output on line 78 from DDS 72 is a clean representative of the input signal on line 52 which is locked to the frequency of the input signal. The signal o line 78 is then applied to other receiver components of the tracking system. Line 56 is also taken from output line 78 to apply the feedback signal to phase detector 54 as described above.

Figure 4:
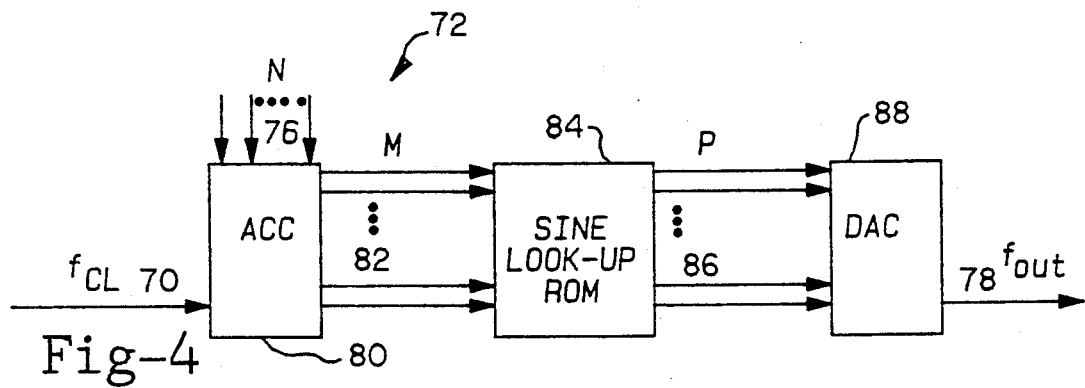
FIG. 4 is a block diagram of the direct digital synthesizer of FIG. 3.

FIG. 4 shows the major circuit components in block diagram form of DDS 72. The heart of DDS 72 is an accumulator 80 which accepts the clocking pulse on line 70 from VCO 68 and the N-bit digital frequency command word on lines 76 from the coarse tuning circuit 74. An output on lines 82 is an M-bit output of accumulator 80 incremented by the clocking pulse on line 70. The signals on lines 82 are applied to a sine look-up read only memory (ROM) 84. Sine look-up ROM 84 takes the M-bit phase representation from accumulator 80 and converts it to a P-bit amplitude signal on lines 86 representative of the phase bits. The P-bits on lines 86 are applied to a digital-to-analog converter 88. The digital-to-analog converter 88 converts the P-bit representative signal on lines 86 to an analog output on line 78 which is a clean representative of the input signal on line 52 of FIG. 3.

In operation, phase detector 54 compares the phase of the input signal on line 52, which has a frequency changing with time, with the return signal on line 56. Phase detector 54 then emits a DC magnitude signal on line 58 representative of the phase difference between these two signals. If the input signal on line 52 does not change frequency, the signal on line 56 will already be locked to this frequency, and thus, the DC signal will not change. This DC signal on line 58 is applied to loop filter 60 to actively remove all remaining AC components at a relatively high frequency. The remaining pure DC signal on line 62 is applied to a gain compensation network 64 to maintain the loop gain of PLL 50 constant since the ratio of frequencies on lines 70 and 78 will change as the loop is tuned to differing frequencies. Therefore, the DC signal on line 66 will vary linearly with a change in frequency on input line 52. VCO 68 converts the DC representative signal on line 66 back to an AC signal on line 70 having a narrow range of frequencies.

The AC signal on line 70 acts as a clocking pulse for accumulator 80. Before the signal on line 70 is applied to accumulator 80 it is level shifted by a level shifting circuit (not shown) to convert the AC signal on line 70 to a square wave pulse typical of clock signals. Also applied to accumulator 80 is a digital N-bit signal on lines 76 from coarse tuning circuit 74. This N-bit signal is a digital representation of the estimated frequency of the input signal on line 52. Each time accumulator 80 receives a clock pulse on line 70, the N-bit word on lines 76 is added to the previous contents of accumulator 80. The overflow rate of accumulator 80 determines the output frequency on line 78 of DDS 72 and is a function of the N-bit word on lines 76, the clock frequency on line 70, and the number of bits of resolution in accumulator 80. In other words, whatever the sequence of 0 or 1 bits loaded into the accumulator register from coarse tuning network 74, they are outputted on lines 82 at a rate dictated by the clocking frequency from the narrow band VCO 68. Therefore, VCO 68 automatically tunes DDS 72 exactly to the correct input frequency, independent of the frequency resolution of DDS 72. The output on lines 82 are generally a sawtooth wave representative of the phase information of the digital frequency command word adjusted by the fine tuning clock pulse from VCO 68. This M-bit signal is applied to sine look-up ROM 84 to convert the phase information to sine bits having an amplitude representation. This amplitude representative signal is outputted from ROM 84 on the P-bit output lines 86 and applied to the digital-to-analog converter 88. Digital-to-analog converter 88 converts the digital signal back to an analog signal on line 78. This analog signal has a frequency locked onto the frequency of the input signal on line 52.

It is most desirable to have the number of N-bits on lines 76 applied to accumulator 80 equal to the number of M-bits inputted to ROM 84 on lines 82. And further, to have the number of P-bits inputted into digital-to-analog converter 88 also equal N-bits. Maintaining the highest number of bits possible obviously increases the bit information, and thus, the frequency resolution. As a practical matter however, the hardware implementation limitations of the ROM 84 and digital-to-analog converter 88 will force the useable bits of the ROM 84 and DAC 88 to be less than those of accumulator 80. Since the least significant bits will be those truncated by the ROM 84 and DAC 88, it is still desirable to keep the accumulator bits as high as possible, even though the ROM 84 and DAC 88 bits will be less.

By this configuration of VCO 68 and DDS 72, PLL 50 can achieve very wideband tracking with high spectral purity and minimal hardware. DDS 72 provides the means for tracking over a very wide bandwidth, and VCO 68 is only required to fine tune (<1% change in frequency) loop 50 to overcome any frequency resolution limitations of the DDS 72. Even though DDS 72 is capable of very fine frequency resolution, it still resolves the frequency in discrete steps. VCO 68 provides the means to resolve frequencies between these steps.

The resolution "$f_{res}$" of DDS 72 is given by:

$$f_{RES} = \frac{f_{CL}}{2^N} \quad (1)$$

where $f_{cl}$ = accumulator clock frequency on line 70, and
$N$ = bit length of the accumulator.

The output frequency "$f_{out}$" on line 78 of DDS 72 is given by:

$$f_{out} = f_{cl} \sum_{n=1}^{N} a_n 2^{-n} \quad (2)$$

where $a_n$ = logic state of the nth most significant bit (MSB) of the accumulator (0 or 1).

It is apparent from Equation (2) that the frequency on output line 78 can be changed by either adjusting the digital command word $a_n$ on line 76, or by adjusting the clock frequency $f_{cl}$ on line 70. The digital control word $a_n$ is applied to accumulator 80 of DDS 72 from coarse pretuning circuit 74. This coarse estimation of the input frequency on line 52 can be attained by digitally sweeping or digitally pretuning for the correct lock frequency from input line 52. A digital sweeping system (not shown), such as a digital counter, would be used when the input frequency is completely unknown. The sweeping system would digitally sweep a range of frequencies by bit representation until the PLL 50 achieves a lock on the input frequency. The sweeping system is then shut off until the PLL 50 becomes unlocked. A digital pretuning system (not shown) would be used when an approximation of the input frequency is known.

Once the coarse tuning of PLL 50 is attained by one of these methods and is applied to the N-bits on lines 76, the output frequency on line 78 can be fine tuned by the narrow range of VCO 68 which applies the clock frequency to the accumulator 80. Since VCO 68 need only operate on a very narrow tuning range, because it only operates as a fine tuning device, certain very stable devices such as crystals, SAW resonators or dielectric resonators can be used to obtain excellent spectral purity. The determination of which VCO would be most appropriate would depend on the clocking frequency desired. Therefore, any frequency resolution limitations of DDS 72 can be corrected by VCO 68.

Typical DDS's have an accumulator register with 24-bits. Therefore, pretuning accuracy can be achieved on the order of 1 in $2^{24}$ of the clocking frequency. This enables loop bandwidths to be very small while ensuring that the PLL 50 has timely lock-up. In practice, a typical DDS could have an extremely broad tuning range, ranging approximately from a DC value to about 40 percent of the clock frequency, $0 < f_{out} < 0.4 \, f_{cl}$. The limitations of frequency would depend primarily on the filter realizations of the DDS.

Figure 5:
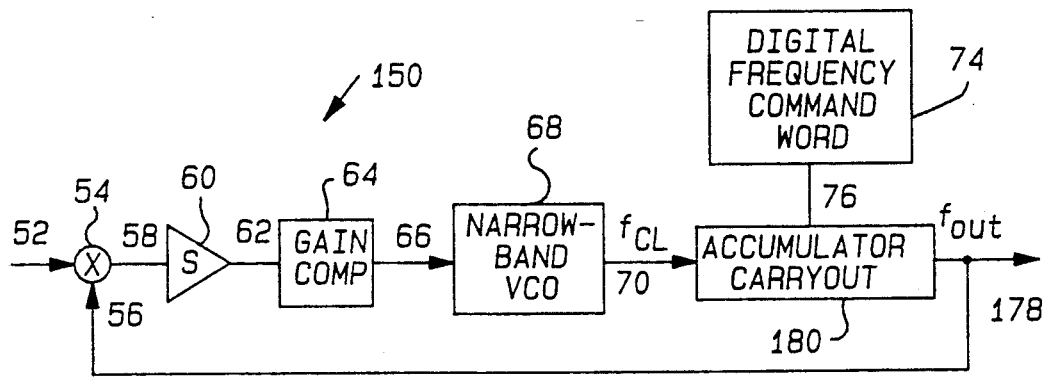
FIG. 5 is a block diagram of a phase-locked loop incorporating a modification of the embodiment of FIG. 3.

Now turning to FIG. 5, a modification of PLL 50 is shown represented generally by 150. In this figure like components are indicated as having the same reference numerals to those of FIG. 3. Here, DDS 72 is replaced by just an accumulator 180 having an accumulator carryout of the most significant bit (MSB) of accumulator 180 on line 178. This simplification of PLL 50 can be used in clock recovery applications where harmonic spur content is not critical. The output signal on line 178 is a carry out of the bit overflow of the most significant bit (MSB) from accumulator 180, and is also represented by Equation (2). The digital output on line 178 can be converted to an analog signal, or in some cases, phase detector 54 can accept a digital signal. The rate of the output of this bit is altered by the clocking pulse on line 70. Since commercially available accumulators can operate at several gigahertz, a significant speed advantage is gained by the configuration of FIG. 5.

Since VCO 68 operates over a narrow range, its modulation sensitivity or linearity remains substantially constant even though the DDS 72 tunes over a relatively broad band. The modulation sensitivity "$K_{VCO}$" of VCO 68 is represented by:

$$K_{VCO} = \frac{df_{out}}{dV_{IN}} \qquad (3)$$

where $df_{out}$=change of output frequency on line 78, and
$dV_{IN}$=change of DC voltage input on line 66.

The gain of DDS 72, however, will vary substantially linearly with frequency due to the changing ratio of the output frequency of DDS 72 on line 78 and the clock frequency on line 70 as the loop tracks and tunes to varying input frequencies on line 52. The gain "$K_{DDS}$" of DDS 72 is represented by:

$$K_{DDS} = \frac{df_{DDS}}{df_{VCO}} \qquad (4)$$

where $df_{DDS}$=change of output frequency on line 78, and
$df_{VCO}$=change of output frequency of VCO.

Figure 6:
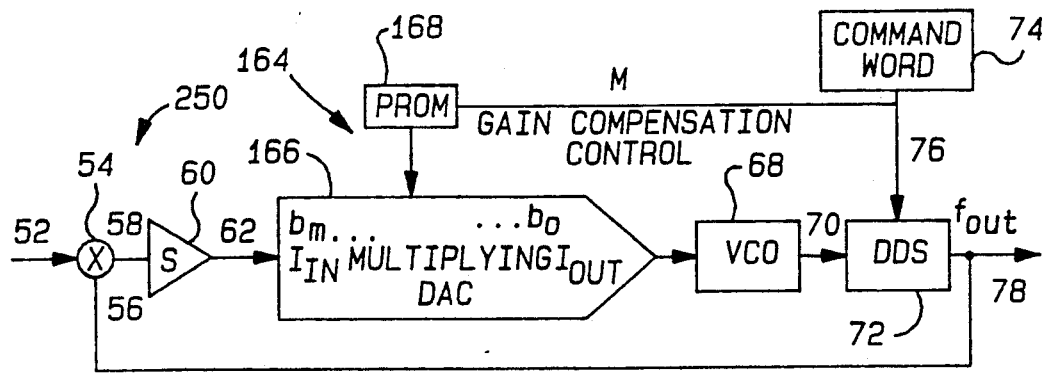
FIG. 6 is a block diagram of the embodiment of FIG. 3 incorporating a gain compensation circuit.

FIG. 6 shows a PLL 250 in which gain compensation network 64 is replaced by gain compensation network 164 including a multiply digital-to-analog converter (DAC) 166 and a programmable read only memory (PROM) 168. The current gain "$K_{DAC}$" of DAC 166 is given by:

$$K_{DAC} = \frac{dI_{OUT}}{dI_{IN}} = \frac{\sum_{n=1}^{M} b_n 2^{-n} I_{IN}}{I_{IN}} = \sum_{n=1}^{M} b_n 2^{-n} \qquad (5)$$

where $dI_{out}$=change in current on line 66;
$dI_{in}$=change in current on line 62;
$b_n$=logic state of the nth MSB of DAC 166; and
M=bit length of DAC.

Since both the DDS gain and the DAC gain vary linearly, the N-bit word as applied to the accumulator by pretuning network 74, can be used to program DAC 166 by PROM 168. The output of PROM 168 in response to the digital command word on line 76 is then applied to DAC 166 on line 170. In other words, the current $I_{out}$ leaving DAC 166 is determined by multiplying the current $I_{in}$ entering DAC 166 times the digital word stored in PROM 168. Therefore, the gain of PLL 250 is compensated relative to the estimated pretuning frequency.

Figure 7:
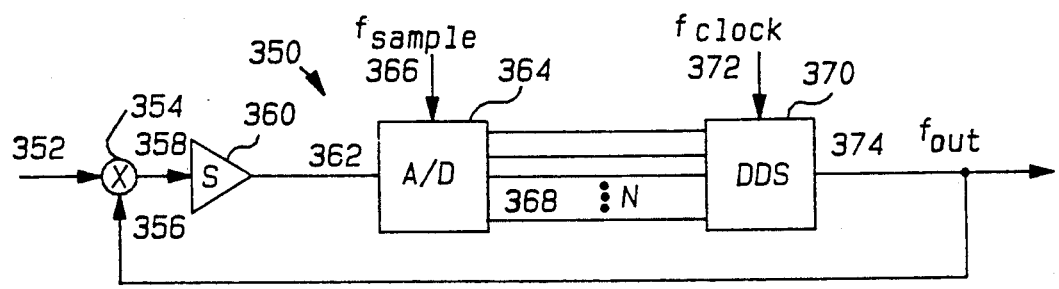
FIG. 7 is a block diagram of a phase-locked loop according to a second preferred embodiment of the invention.

Now turning to FIG. 7, a second preferred embodiment is shown. In this embodiment, VCO 68 of the first preferred embodiment is replaced with an analog-to-digital converter (A/D) 364. A phase-locked loop 350 has an input signal on line 352 which has a frequency varying with time and a return signal on line 356, both being applied to a phase detector 354 as disclosed above for PLL 50. The output of phase detector 354 on line 358 is a DC magnitude voltage representation of the phase difference between these two signals and is once again inputted into a voltage integrator low-pass loop filter 360 to remove any remaining high frequency AC components. The output of loop filter 360 on line 362 is applied to an analog-to-digital converter 364 instead of the gain compensation network 64 and VCO 68 as in the first embodiment. Analog-to-digital converter 364 also has a constant sampling input labeled "$F_{sample}$" applied to it on line 366. The output of analog-to-digital converter 364 is produced on N output lines 368 and applied to a DDS 370. DDS 370 further has a substantially constant clock pulse on line 372 applied to it from a clocking network (not shown). The output of DDS 370 on line 374 is a reconstruction of the input signal on line 352 locked onto its particular frequency and being virtually clean of all noise elements. The return signal on line 356 applied to phase detector 354 is sampled off of line 374.

Figure 8:
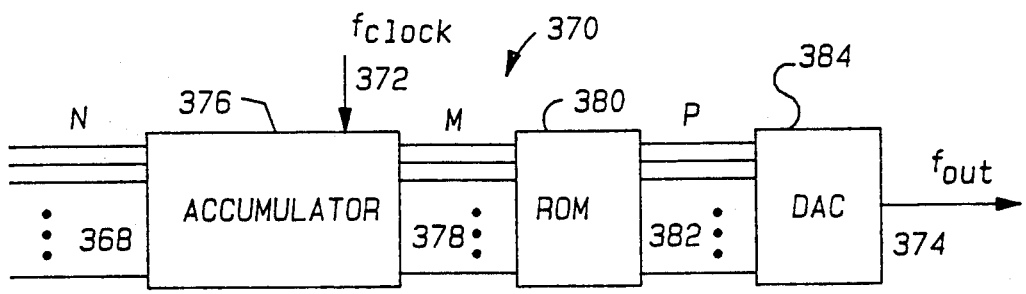
FIG. 8 is a block diagram of the DDS of the second preferred embodiment of FIG. 7.

FIG. 8 shows the main components of DDS 370 in a block format. Once again, DDS 370 has the same major components as that of DDS 72. Specifically, the digital representation of the frequency signal from analog-to-digital converter 364 on line 368 is applied to an accumulator 376 having an M-bit adder and register. A constant clock signal is applied to accumulator 376 along line 372. An M-bit output of accumulator 376 is applied to sine look-up read only memory (ROM) 380 along M lines 378. A P-bit output of ROM 380 is applied to digital-to-analog converter 384 along P-bit lines 382. The digital-to-analog converter 384 converts the digital signal back to a frequency signal on output line 374.

In operation, the DC signal on line 362 of the embodiment of FIG. 7 is achieved the same way as that on line 62 of PLL 50 in FIG. 3. The DC signal on line 362 is applied to analog-to-digital converter 364 which converts it to an N-bit digital representation of the DC magnitude signal. The digital representation is held in A/D 364 until it receives a sampling signal from $F_{sample}$ on line 366. $F_{sample}$ is held in A/D 364 until it receives a sampling signal from $F_{sample}$ on line 366. $F_{sample}$ is a clocking pulse which is set at a rate determined by the PLL 350. Specifically, the DC signal sets the bits within A/D 364 and $F_{sample}$ adjusts the rate at which the bits are outputted to accumulator 376. The N-bit output of analog-to-digital converter 364 on lines 368 is therefore proportional to the frequency of the input signal on line 352. To avoid stability problems, the sample rate (determined by $F_{sample}$) of analog-to-digital converter 364 should be made about 10 times the loop bandwidth. Typically, this sample rate would be less than 50 kHz. The N-bits on lines 368 are then applied to accumulator 376. Accumulator 376 emits an M-bit signal along lines 378 determined by the N-bits from analog-to-digital converter 364 at a rate governed by the clock pulse $F_{clock}$ along line 372. It is most desirable to make N as large as possible since N determines the frequency resolution of the analog-to-digital converter 364 and DDS 370 combination. This digital representation of the phase of the desired output frequency on line 378 is applied to sine look-up ROM 380 to convert it to an amplitude representation of this signal. The amplitude representation is then applied to digital-to-analog converter 384 from P-bit lines 382 to convert the amplitude digital signal back to an analog signal. The analog output of digital-to-analog converter 384 is on line 374.

As noted above, the output frequency on line 374 can be changed by adjusting the digital input word to accumulator 376 on line 368. This is indicated by Equation (2), since $F_{clock}$ is constant. Because of this, the change in output frequency is exactly proportional to changes in the input word. Therefore, the modulation sensitivity or linearity is controlled only by the linearity of the analog-to-digital converter 364 and the quantization level (M) of the accumulator. The modulation sensitivity "$K_{mod}$" of PLL 350 is given by:

$$K_{mod} = K_{A/D} \cdot K_{DDS} = \frac{\left(\sum_{n=1}^{M} 2^{-n}\right)}{V_{max}} \cdot \tag{6}$$

$$\frac{f_{out,max}}{\left(\sum_{n=1}^{M} 2^{-n}\right)} = \frac{f_{out,max}}{V_{max}} = \frac{0.4 f_{cl}}{V_{max}}$$

where
$K_{A/D}$=modulation sensitivity of A/D 364;
$K_{DDS}$=modulation sensitivity of DDS;
M=quantization level of A/D 364;
$V_{max}$=full scale output; and
$f_{out, max}$=0.4 $f_{cl}$.

For a typical 16-bit audio analog-to-digital converter, linearity is on the order of 1 in $2^{16}$ or 0.001 percent over the entire tuning range of DDS 370. This accuracy of the linearity of the analog-to-digital converter 364 obviates the need for any gain compensation circuitry to maintain constant loop parameters such as damping, natural frequency, stability and noise performance. This feature enables the phase-locked loop 350 to be aligned and tested at a single frequency, thus resulting in reduced tuning time.

Figure 9:
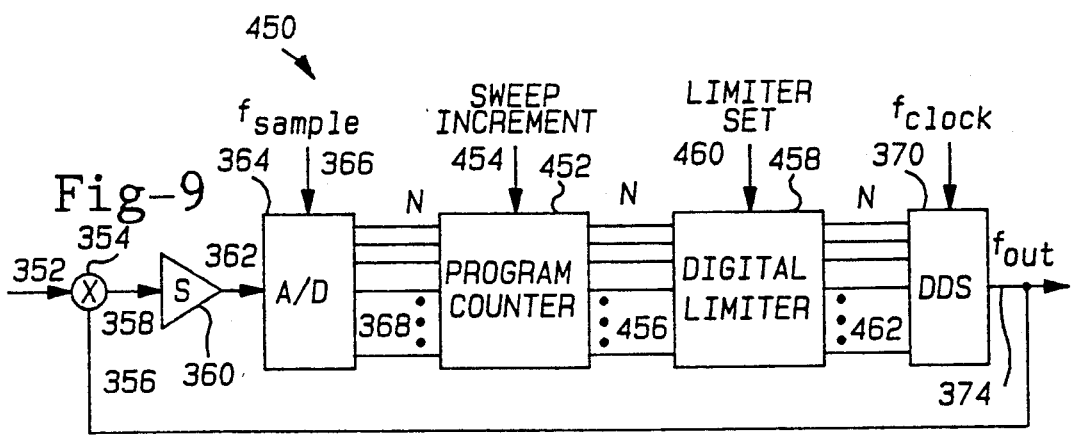
FIG. 9 is a block diagram of a phase-locked loop incorporating a modification to the second preferred embodiment of FIG. 7.

Now turning to FIG. 9, additional features of the second preferred embodiment indicated generally by phase-locked loop 450 are shown. Once again the output of loop filter 360 is applied to analog-to-digital converter 364 along with the sampling signal $F_{sample}$ on line 366. The output of analog-to-digital converter 364 is temporarily disabled while an external sweep increment command signal on line 454 initiates a digital counter for incrementing the loop output frequency until loop acquisition is achieved. The output of program counter 452 is an N-bit output on lines 456. This N-bit output is applied to a digital limiter 458. Along with the input N-bit lines from lines 456 is a limiter set input applied to digital limiter 458 on line 460. The output of digital limiter 458 is an N-bit line on lines 462, which are applied to DDS 370.

Program counter 452 provides a means by which loop acquisition can be attained with ease and accuracy. As described above for pretuning circuit 74 of FIG. 3, program counter 452 provides a digital sweeping signal which increments the DDS accumulator 376 by a predetermined amount until PLL 450 locks onto the input frequency. Once the PLL 450 is set in a lock mode, the programmable counter 452 can be disabled digitally, resulting in zero upset to the phase-locked loop 450.

To prevent the PLL 450 from tuning beyond a predetermined band, a digital limiter 458 can be placed between program counter 452 and DDS 370 to detect any digital word which would tune the phase-locked loop 450 outside of this predetermined band. The limit values would be fully programmable, and the use of a digital word would provide a high degree of accuracy and an absence of any drift due to time, temperature or radiation.

Since a DDS has a finite frequency resolution, small frequency errors may exist for resolution of specific frequencies. This error could be eliminated by making the loop bandwidth greater than the frequency resolution of the DDS.

The above described embodiments disclose a phase-locked loop having very broad band acquisition and tracking capabilities with a high degree of spectral purity and minimal hardware. These phase-locked loops eliminate the need for switching between multiple loops, multiple VCO's or multiple varactor tuning diodes. Further, these phase-locked loops eliminate the frequency resolution limitations of a purely phase-locked DDS.

The foregoing discussion discloses and describes the merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. A phase-locked loop comprising:
   a phase detector for comparing the phase of an input signal having a time varying frequency with a return signal and for generating a DC magnitude signal representative of the comparison;
   an analog-to-digital converter for receiving the DC magnitude signal from the phase detector and generating a digital magnitude signal in response thereto; and
   a direct digital synthesizer for receiving the digital magnitude signal from the analog-to-digital converter and for generating in response thereto an output signal representative of the input signal.

2. The phase-locked loop of claim 1 further comprising means for applying a sampling signal to the analog-to-digital converter.

3. The phase-locked loop of claim 2 wherein the direct digital synthesizer includes an accumulator, for receiving the digital magnitude signal from the analog-to-digital converter and a substantially constant clocking frequency.

4. The phase-locked loop of claim 3 wherein the direct digital synthesizer further includes a sine look-up ROM and a digital-to-analog converter, the ROM receiving a phase output signal from the accumulator and converting it to a digital amplitude output signal and the digital-to-analog converter converting the digital amplitude output signal from the ROM to the output signal representative of the input signal.

5. The phase-locked loop of claim 1 further comprising a program counter, for applying a sweeping signal to the direct digital synthesizer to adjust the synthesizer output signal until it is substantially representative of the input signal.

6. The phase-locked loop of claim 5 further comprising a digital limiter, for limiting the sweep range of the program counter.

7. The phase-locked loop of claim 1 further comprising a loop filter, for removing high frequency signals from the DC magnitude signal.

8. A method of tracking a carrier frequency comprising the steps of:
   applying an input carrier signal to a phase detector;
   applying an output of the phase detector to an analog-to-digital converter;
   applying an output of the analog-to-digital converter to a direct digital synthesizer; and applying an output of the direct digital synthesizer to the phase detector.

9. The method of claim 8 wherein the step of applying an output to the analog-to-digital converter includes applying a sampling signal to the analog-to-digital converter.

10. The method of claim 9 wherein the step of applying an output to the direct digital synthesizer includes applying said output to an accumulator which also receives a substantially constant clocking signal.

11. The method of claim 10 wherein the step of applying an output to the direct digital synthesizer includes applying an output of the accumulator to a sine look-up ROM and applying an output of the ROM to a digital-to-analog converter.

12. The method of claim 8 further comprising the step of applying the output of the analog-to-digital converter and a digital sweep signal to a program counter.

13. The method of claim 8 further comprising the step of applying the output of the analog-to-digital converter and a digital limit set signal to a digital limiter.

14. The method of claim 8 further comprising the step of applying the output of the phase detector to a loop filter.

15. A method of tracking a carrier frequency comprising the steps of:
comparing the phase of an input signal with the phase of a return signal;
generating a digital magnitude signal in response to the comparison;
applying the magnitude signal to a direct digital synthesizer for generating an output signal representative of the input signal in response to the magnitude signal; and
employing the output signal as the return signal.

16. The method of claim 15 further comprising the step of sweeping the direct digital synthesizer through a range of frequencies to adjust the output signal until it is substantially representative of the input signal.

* * * * *